(12) United States Patent
Park et al.

(10) Patent No.: US 11,281,258 B2
(45) Date of Patent: Mar. 22, 2022

(54) DISPLAY DEVICE

(71) Applicant: Samsung Display Co., Ltd., Yongin-Si (KR)

(72) Inventors: Youngsang Park, Seoul (KR); Inseok Seo, Asan-si (KR); HungKun Ahn, Seongnam-si (KR); Young-Shin Pyo, Seongnam-si (KR); Chulho Jeong, Seoul (KR); Sungguk An, Suwon-si (KR); Jangdoo Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/717,002

(22) Filed: Dec. 17, 2019

(65) Prior Publication Data

US 2020/0257338 A1 Aug. 13, 2020

(30) Foreign Application Priority Data

Feb. 11, 2019 (KR) .................. 10-2019-0015632

(51) Int. Cl.
*G06F 1/16* (2006.01)
*G02B 1/14* (2015.01)
*G02B 1/16* (2015.01)

(52) U.S. Cl.
CPC ............. *G06F 1/1656* (2013.01); *G02B 1/14* (2015.01); *G02B 1/16* (2015.01); *G06F 1/1609* (2013.01); *G06F 1/1643* (2013.01); *G06F 1/1652* (2013.01)

(58) Field of Classification Search
CPC .... G06F 1/1656; G06F 1/1609; G06F 1/1643; G06F 1/1652; G06F 3/0446; G02B 1/14; G02B 1/16; H01L 51/5262; H01L 27/3216; H01L 27/323; H01L 51/0097; H04M 1/0268
See application file for complete search history.

(56) References Cited

U.S. PATENT DOCUMENTS

| 8,929,085 | B2 | 1/2015 | Franklin et al. |
| 9,069,521 | B2 | 6/2015 | Lee et al. |
| 9,429,999 | B2 | 8/2016 | Lee et al. |
| 9,661,114 | B2 | 5/2017 | Jeong et al. |
| 10,093,074 | B2 | 10/2018 | Nam et al. |
| 2011/0310333 | A1* | 12/2011 | Kim ................ G02F 1/133528 349/96 |
| 2012/0056211 | A1* | 3/2012 | Kitagawa ............ G02B 5/3083 257/88 |
| 2016/0048169 | A1 | 2/2016 | Yang et al. |

(Continued)

FOREIGN PATENT DOCUMENTS

| JP | 2009251403 A | 10/2009 |
| KR | 1020160042360 A | 4/2016 |

(Continued)

OTHER PUBLICATIONS

Extended European Search Report for Application No. 20156081.0-1216 dated Jul. 15, 2020.

*Primary Examiner* — Rockshana D Chowdhury
(74) *Attorney, Agent, or Firm* — Cantor Colburn LLP

(57) ABSTRACT

A display device includes a display module and a window panel disposed on an upper portion of the display module. The window panel includes a base film, and a functional layer disposed on an upper portion of the base film and having a hard coating agent and an anti-static agent.

16 Claims, 10 Drawing Sheets

(56) References Cited

U.S. PATENT DOCUMENTS

| | | | | |
|---|---|---|---|---|
| 2017/0028677 A1* | 2/2017 | Lee | ........................ | G02B 1/10 |
| 2017/0233606 A1* | 8/2017 | Park | .................... | C09D 183/04 |
| | | | | 428/327 |
| 2018/0019425 A1* | 1/2018 | Yasumoto | .............. | G09G 5/026 |
| 2018/0095502 A1* | 4/2018 | Yamazaki | ............. | G06F 1/1643 |
| 2018/0095559 A1* | 4/2018 | Yamazaki | ............... | G06F 3/042 |
| 2018/0142127 A1 | 5/2018 | Park et al. | | |
| 2019/0034020 A1* | 1/2019 | He | .................... | G06K 9/00033 |

FOREIGN PATENT DOCUMENTS

| | | | |
|---|---|---|---|
| KR | 1020180058912 A | 6/2018 | |
| KR | 1020180090453 A | 8/2018 | |
| KR | 1020180096448 A | 8/2018 | |
| KR | 1020180096449 A | 8/2018 | |
| WO | 2019013366 A1 | 1/2019 | |

* cited by examiner

DISPLAY DEVICE

This application claims priority to Korean Patent Application No. 10-2019-0015632, filed on Feb. 11, 2019, and all the benefits accruing therefrom under 35 U.S.C. § 119, the content of which in its entirety is herein incorporated by reference.

BACKGROUND

1. Field

Exemplary embodiments of the invention herein relate to a display device, and more particularly, to a display device including a window panel including an anti-static agent.

2. Description of the Related Art

Various types of display devices used for multimedia devices such as a television, a mobile phone, a tablet computer, a navigation system, a game machine are being developed. Recently, in order to facilitate portability and improve user convenience, display devices which are deformable, e.g., foldable or rollable, by being provided with bendable and/or flexible display members are being developed.

Flexible display devices desire each member thereof to have flexible properties, and accordingly, polymer film type windows are being used for the display devices.

SUMMARY

When a polymer film type window is used, there is a higher possibility that problems due to static electricity may occur more than when a window using a glass substrate is used.

Exemplary embodiments of the invention provide a display device including a window panel including an anti-static agent, thereby having improved anti-static properties.

Exemplary embodiments of the invention also provide a display device alleviating a touch noise problem and having improved reliability by specifying a layer including an anti-static agent in a window panel.

An exemplary embodiment of the invention provides a display device including at least one folding region, and including a display module and a window panel disposed on the display module. The window panel includes a base film, and a functional layer disposed on the base film and including a hard coating agent and an anti-static agent.

In an exemplary embodiment, the functional layer may be a single layer directly disposed on the base film.

In an exemplary embodiment, a weight of the anti-static agent based on a weight of a total weight of the functional layer may be about 5 wt % to about 15 wt %.

In an exemplary embodiment, the functional layer may include a hard coating layer including the hard coating agent and disposed on the base film and an anti-static layer disposed on an upper portion of the hard coating layer and including the anti-static agent.

In an exemplary embodiment, the window panel may have a surface resistance greater than about $10^9$ ohms/square ($\Omega$/sq) and less than about $10^{13}$ $\Omega$/sq.

In an exemplary embodiment, the anti-static agent may include at least one among $Sb_2O_5$, $SnO_2$, ammonium (NH4+), phosphonium (PH4+), Imidazolium, Pyridinium, and lithium ions (Li+).

In an exemplary embodiment, the display module may include a display panel and an input sensing unit directly disposed on the display panel.

In an exemplary embodiment, the display panel may include a display element layer and an encapsulation layer disposed on an upper portion of the display element layer. The input sensing unit may be directly disposed on an upper portion of the encapsulation layer.

In an exemplary embodiment, the window panel may further include an anti-fingerprint layer disposed on the functional layer.

In an exemplary embodiment, the display device may further include a polarizing layer disposed between the display module and the window panel.

In an exemplary embodiment, the display device may further include a color filter layer disposed between the display module and the window panel.

In an exemplary embodiment, the at least one folding region may have a radius of curvature of about 5 millimeters (mm) or less.

In an exemplary embodiment of the invention, a display device includes a display panel, an input sensing unit directly disposed on an upper portion of the display panel, and a window panel disposed on an upper portion of the input sensing unit. The window panel includes a base film, and a functional layer disposed on an upper portion of the base film and including a hard coating agent and an anti-static agent.

In an exemplary embodiment, the functional layer may be a single layer directly disposed on an upper portion of the base film.

In an exemplary embodiment, the functional layer may include a hard coating layer including the hard coating agent and disposed on an upper portion of the base film, and an anti-static layer disposed on an upper portion of the hard coating layer and including the anti-static agent.

In an exemplary embodiment, the display panel may include non-folding regions and a folding region disposed between the non-folding regions.

In an exemplary embodiment of the invention, a display device includes a folding region deformable into a folded shape along a folding axis extending in one direction, and including a display panel, an input sensing unit disposed on the display panel, and a window panel disposed on the input sensing unit. The window panel includes a base film, and a functional layer disposed on the base film and including a hard coating agent and an anti-static agent.

In an exemplary embodiment, the functional layer may be a single layer directly disposed on the base film.

In an exemplary embodiment, the functional layer may include a hard coating layer disposed on the base film and including the hard coating agent, and an anti-static layer disposed between the hard coating layer and the anti-fingerprint layer and including the anti-static agent but not the hard coating agent.

In an exemplary embodiment, the anti-static agent may include lithium ions (Li+).

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
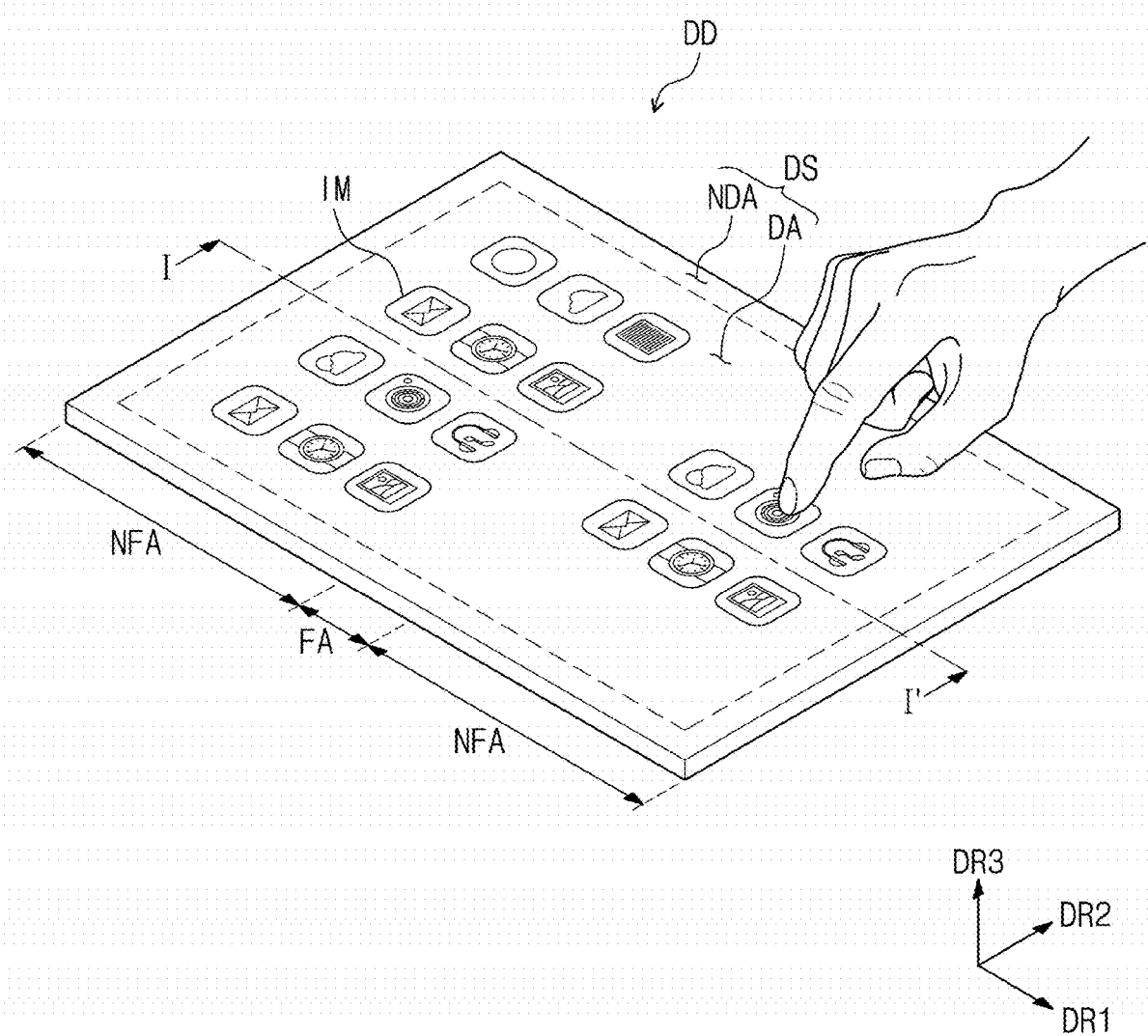
FIG. 1 is a perspective view of an exemplary embodiment of a display device according to the invention.

The invention may be modified in many alternate forms, and thus specific embodiments will be exemplified in the drawings and described in detail. It should be understood, however, that it is not intended to limit the invention to the particular forms disclosed, but rather, is intended to cover all modifications, equivalents, and alternatives falling within the spirit and scope of the invention.

In the invention, when an element (or a region, a layer, a portion, etc.) is referred to as being "on," "connected to," or "coupled to" another element, it means that the element may be directly disposed on/connected to/coupled to the other element, or that a third element may be disposed therebetween.

In the specification, "directly disposed" means that there is no layer, film, region, plate or the like added between a portion of a layer, a film, a region, a plate or the like and other portions. For example, "directly disposed" may mean disposing without additional members such as an adhesive member between two layers or two members.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the invention. The terms of a singular form may include plural forms unless the context clearly indicates otherwise.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a display device according to the invention will be described with reference to the accompanying drawings.

Figure 2:
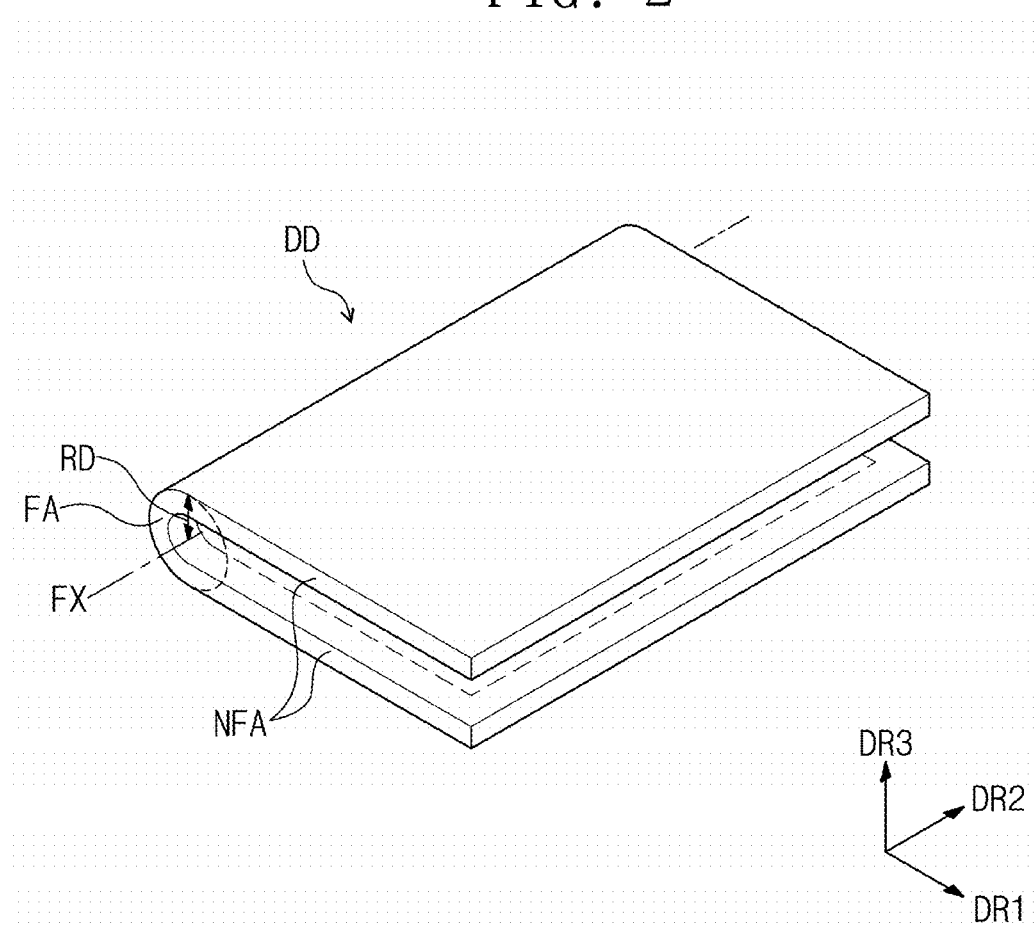
FIG. 2 is a view illustrating the display device shown in FIG. 1 in a folded state.

FIG. 1 is a perspective view of an exemplary embodiment of a display device according to the invention. FIG. 2 is a view illustrating the display device shown in FIG. 1 in a folded state.

Referring to FIG. 1, a display device DD of an exemplary embodiment may have a rectangular shape which has long sides extending in a first direction axis DR1 direction and short sides extending in a second direction axis DR2 direction which crosses the first direction axis DR1. However, the invention is not limited thereto. In other exemplary embodiments, the display device DD may have various shapes such as circular and polygonal shapes. In an exemplary embodiment, the display device DD may be a flexible display device.

In an exemplary embodiment of the display device DD, a display surface DS on which an image IM is displayed may be parallel to a plane defined by the first direction axis DR1 and the second direction axis DR2. The normal direction of the display surface DS, that is, the thickness direction of the display device DD is indicated by a third direction axis DR3. A front surface (or an upper surface) and a rear surface (or a lower surface) of each member may be defined by the third direction axis DR3. However, the directions indicated by the first to third direction axes DR1, DR2, and DR3 are relative concepts, and may thus be converted to other directions. Hereinafter, first to third directions correspond to directions indicated by the first to third direction axes DR1, DR2, DR3, respectively, and are given the same reference numerals.

The display device DD of an exemplary embodiment may include a folding region FA and a non-folding region NFA. Referring to FIGS. 1 and 2, the display device DD may include the folding region FA and a plurality of non-folding regions NFA. The folding region FA is disposed between the non-folding regions NFA, and the folding region FA and the non-folding regions NFA may be arranged adjacent to each other in the first direction axis DR1 direction.

The folding region FA may be a portion deformable into a folded shape along a folding axis FX extending in the direction of the second direction axis DR2. In an exemplary embodiment, the folding region FA may have a radius of curvature RD of about 5 millimeter (mm) or less, for example.

FIGS. 1 and 2 exemplarily show one folding region FA and two non-folding regions NFA. However, the numbers of the folding region FA and the non-folding regions NFA are not limited thereto. In an exemplary embodiment, the display device DD may include a plurality of non-folding regions NFA which are more than two and a plurality of folding regions FA disposed between the non-folding regions NFA, for example.

In the display device DD of an exemplary embodiment, the non-folding regions NFA may be disposed to be symmetrical to each other with respect to the folding region FA. However, the invention is not limited thereto. The folding region FA is disposed between the non-folding regions NFA, but the areas of two non-folding regions NFA facing each other with respect to the folding region FA may be different.

The display surface DS of the display device DD may include a display region DA and a non-display region NDA around the display region DA. The display region DA displays an image, and the non-display region NDA may not display an image. The non-display region NDA surrounds the display region DA, and may define the edge of the display device DD.

Referring to FIG. 2, the display device DD may be a foldable display device DD which is folded or unfolded. In an exemplary embodiment, the folding region FA may be folded along the folding axis FX which is parallel to the second direction axis DR2, so that the display device DD is folded, for example. The folding axis FX may be defined as a short axis parallel to a short side of the display device DD.

When the display device DD is folded, the non-folding regions NFA face each other, and the display device DD may be in-folded such that the display surface DS is not exposed to the outside. However, the invention is not limited thereto. Unlike the case illustrated in the drawing, the display device DD may be out-folded such that the display surface DS is exposed to the outside.

Figure 3:
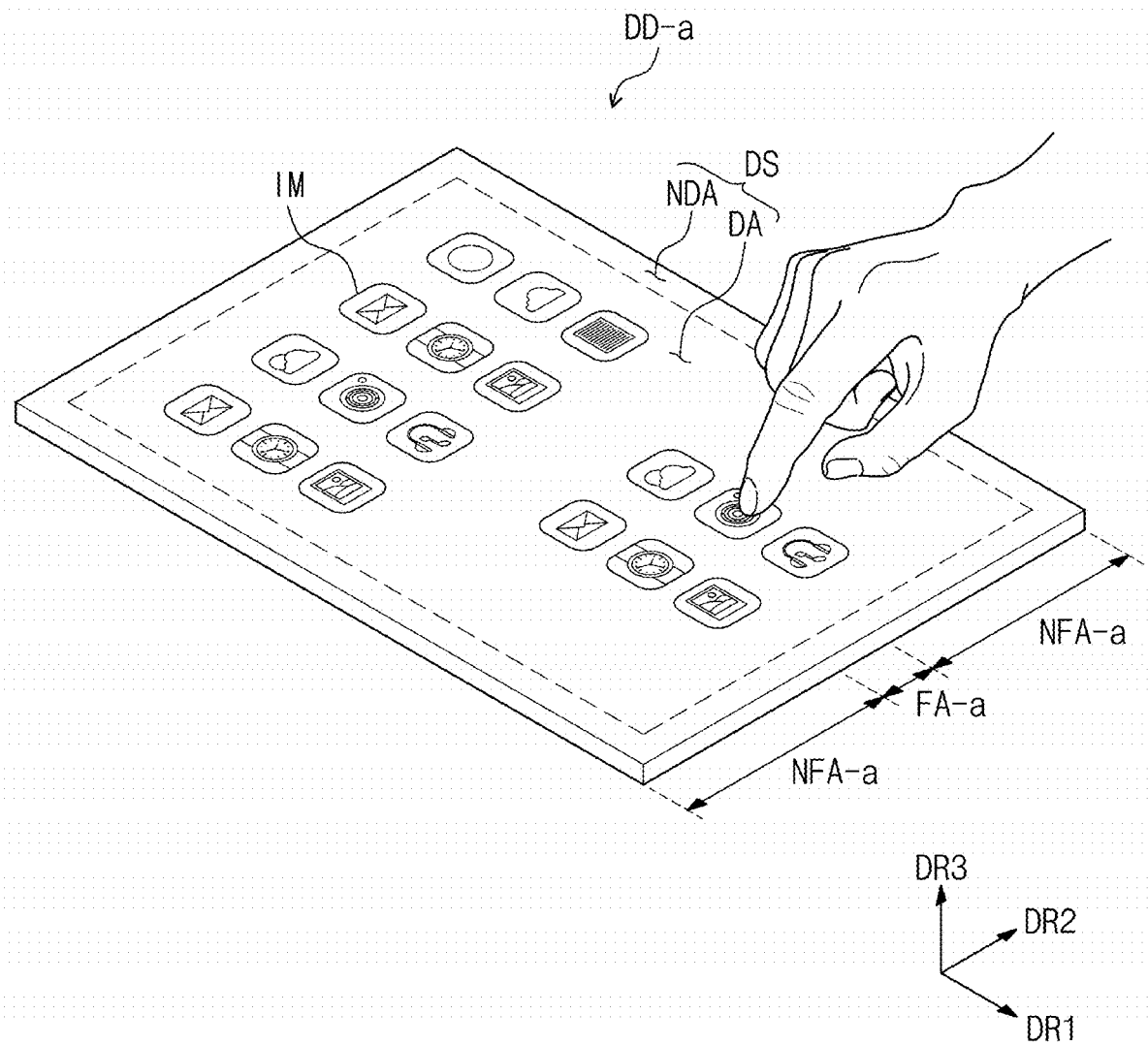
FIG. 3 is a perspective view of an exemplary embodiment of a display device according to the invention.
Figure 4:
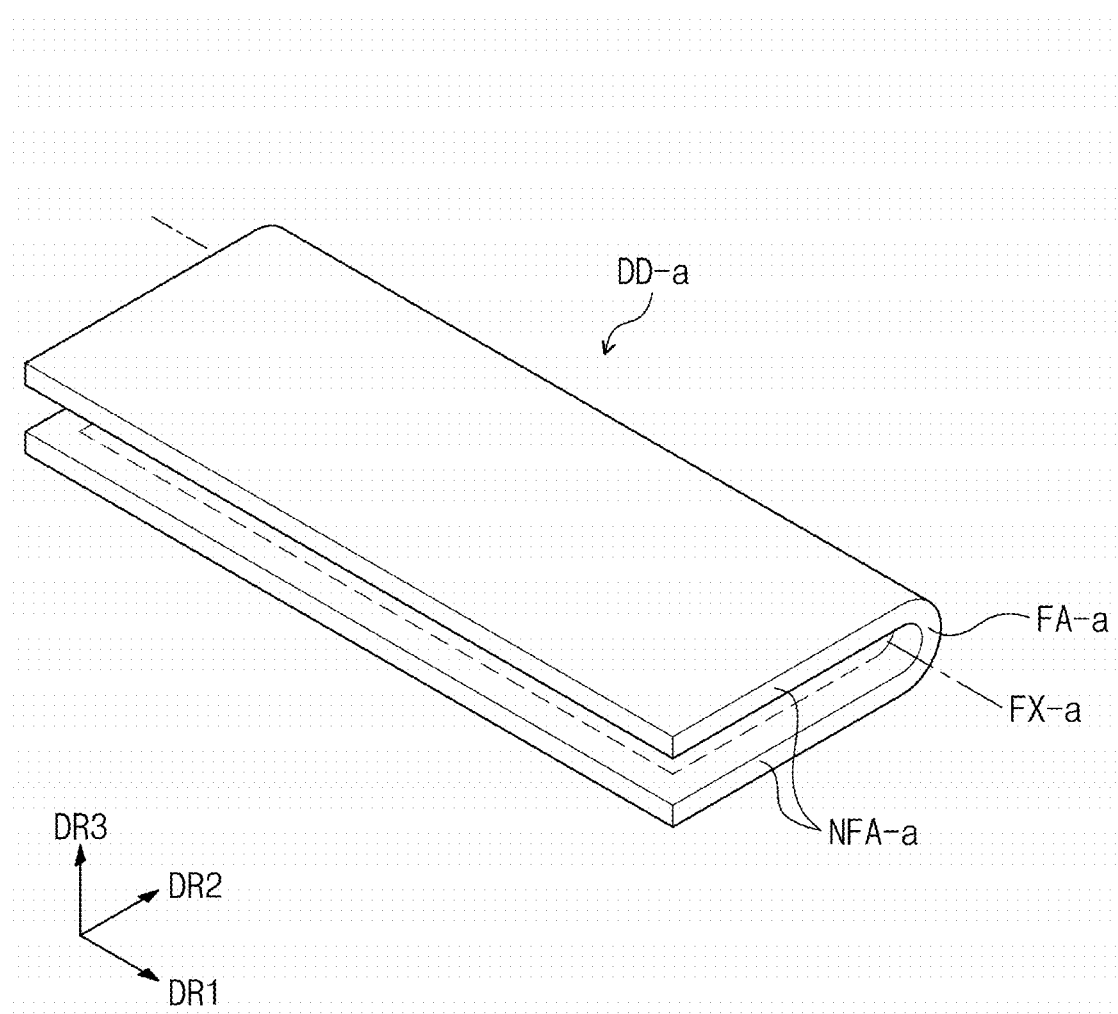
FIG. 4 is a view illustrating the display device shown in FIG. 3 in a folded state.

FIG. 3 is a perspective view of an exemplary embodiment of a display device according to the invention. FIG. 4 is a view illustrating the display device shown in FIG. 3 in a folded state.

Except for a folding operation, a display device DD-a illustrated in FIG. 3 may have substantially the same configuration as that of the display device DD illustrated in FIG. 1. Therefore, hereinafter, the folding operation will be mainly described in the description of the display device DD-a illustrated in FIGS. 3 and 4.

Referring to FIGS. 3 and 4, the display device DD-a may include a folding region FA-a and a plurality of non-folding regions NFA-a. The folding region FA-a is disposed between the non-folding regions NFA-a, and the folding region FA-a and the non-folding regions NFA-a may be arranged adjacent to each other in the second direction axis DR2.

The folding region FA-a may be folded along a folding axis FX-a which is parallel to the first direction axis DR1, so that the display device DD-a is folded. The folding axis FX-a may be defined as a long axis parallel to a long side of the display device DD-a. The display device DD illustrated in FIG. 1 may be folded along the short axis, whereas the display device DD-a illustrated in FIG. 3 may be folded along the long axis. In FIG. 4, the display device DD-a is illustrated as being in-folded such that a display surface DS is not exposed to the outside. However, the invention is not limited thereto. The display device DD-a is folded along the long axis and may be out-folded.

Hereinafter, the display device DD folded along the short axis will be described in the description of a display device of an exemplary embodiment. However, the invention is not limited thereto. The content to be described hereinafter may be applied to the display device DD-a folded along the long axis.

Figure 5:
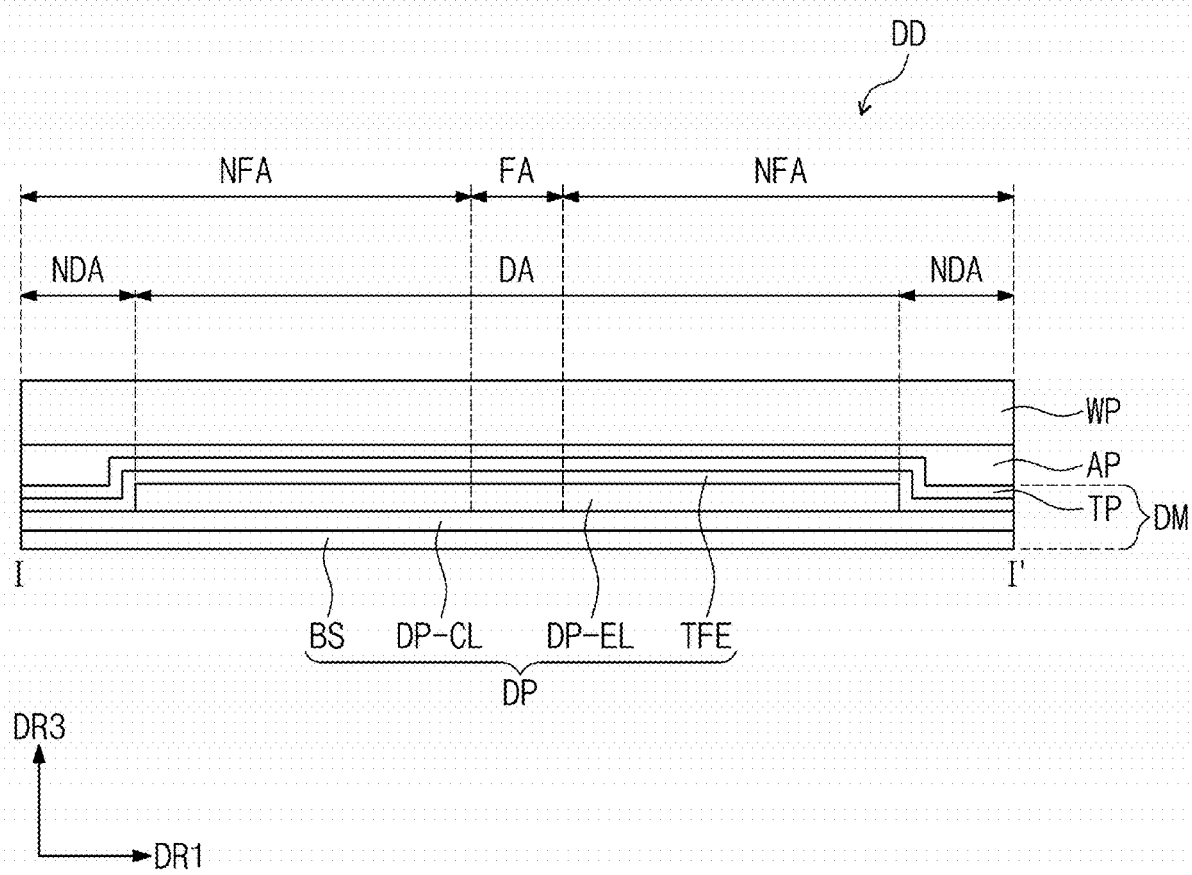
FIG. 5 is a cross-sectional view of an exemplary embodiment of a display device according to the invention.
Figure 6:
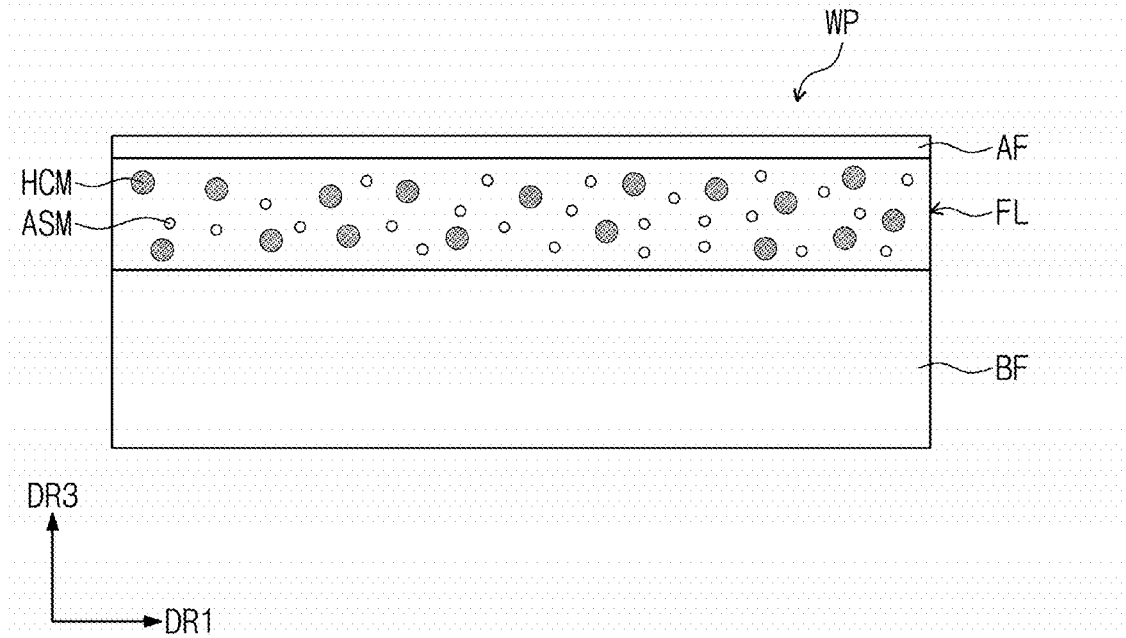
FIG. 6 is a cross-sectional view of an exemplary embodiment of a window panel according to the invention.
Figure 7:
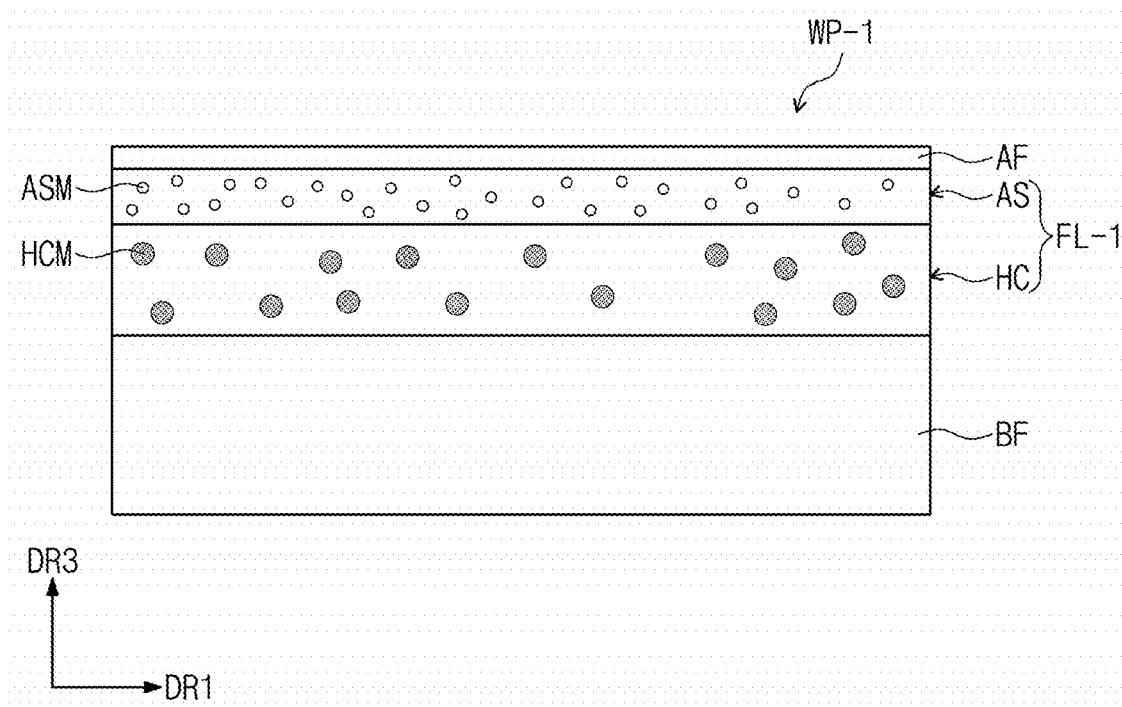
FIG. 7 is a cross-sectional view of an exemplary embodiment of a window panel according to the invention.

FIG. 5 is a cross-sectional view of the display device DD of an exemplary embodiment. FIG. 5 may be a cross-sectional view taken along line I-I' of FIG. 1. FIG. 6 is a cross-sectional view of an exemplary embodiment of a window panel WP according to the invention. FIG. 6 shows an exemplary embodiment of the window panel WP included in the display device DD of an exemplary embodiment illustrated in FIG. 5. FIG. 7 is a cross-sectional view of an exemplary embodiment of a window panel WP-1 according to the invention.

The display device DD of an exemplary embodiment may include a display module DM and a window panel WP disposed on the display module DM. The display module DM may include a display panel DP including a display element layer DP-EL and an input sensing unit TP disposed on the display panel DP. The window panel WP may be disposed on the input sensing unit TP.

The display device DD may further include an adhesive layer AP disposed between the input sensing unit TP and the window panel WP. In an exemplary embodiment, the adhesive layer AP may include an optical clear adhesive, for example.

The display panel DP may include a base substrate BS, a circuit layer DP-CL disposed on the base substrate BS, the display element layer DP-EL disposed on the circuit layer DP-CL, and an encapsulation layer TFE covering the display element layer DP-EL.

The input sensing unit TP may be disposed on the encapsulation layer TFE of the display panel DP. In an exemplary embodiment, the input sensing unit TP may be directly disposed on the encapsulation layer TFE of the display panel DP.

The input sensing unit TP senses an external input and changes the sensed external input into a predetermined input signal, and may provide the input signal to the display panel DP. In an exemplary embodiment, in the display device DD of an exemplary embodiment, the input sensing unit TP may be a touch sensing unit for sensing a touch, for example. The input sensing unit TP may sense a direct touch of a user, an indirect touch of a user, a direct touch of an object, or an indirect touch of an object, and the like. The input sensing unit TP may sense at least one of the position of a touch or the intensity (pressure) of a touch which is applied externally. The input sensing unit TP in an exemplary embodiment of the invention may have various configurations, or may be composed of various materials, but is not limited to any one embodiment. The input sensing unit TP may include a plurality of sensing electrodes SEL1 and SEL2 (refer to FIG. 9) for sensing an external input. The sensing electrodes SEL1 and SEL2 (refer to FIG. 9) may sense an external input in a capacitive manner. The display panel DP receives an input signal from the input sensing unit TP, and may generate an image corresponding to the input signal.

The window panel WP may protect the display panel DP and the input sensing unit TP. The image IM generated from the display panel DP may be provided to a user by being transmitted through the window panel WP. The window panel WP may provide a touch surface of the display device DD. In the display device DD including the folding region FA, the window panel WP may be a flexible window.

In the display devices DD in exemplary embodiments, a window panel WP may include a base film BF and a functional layer FL disposed on the base film BF, and a window panel WP-1 may include a base film BF and a functional layer FL-1. In addition, each of the window panels WP and WP-1 in exemplary embodiments may further include an anti-fingerprint layer AF disposed on each of the functional layers FL and FL-1.

The base film BF may include a polymer material. In an exemplary embodiment, the base film BF may include polyimide, polyacrylate, polymethylmethacrylate ("PMMA"), polycarbonate ("PC"), polyethylenenaphthalate ("PEN"), polyvinylidene chloride, polyvinylidene difluorid ("PVDF"), polystyrene, ethylene vinylalcohol copolymer, or a combination thereof, for example. However, the material for the base film BF used in an exemplary embodiment is not limited to the polymer materials described above. Any material may be used without limitation as long as it has optical transparency capable of providing the image IM provided from the display panel DP of the display device DD to a user. Specifically, in the display devices DD in exemplary embodiments, each of the window panels WP and WP-1 may use a polyimide film as the base film BF.

The base film BF may be a member for providing a base surface on which the functional layers FL and FL-1, the anti-fingerprint layer AF, and the like are disposed. The base film BF of each of the window panels WP and WP-1 may be disposed more adjacent to the display panel DP than each of the functional layers FL and FL-1 is to the display panel DP.

In an exemplary embodiment, the thickness of the base film BF may be about 40 micrometers (μm) to about 100 μm, for example. In an exemplary embodiment, when the thickness of the base film BF is less than about 40 μm, for example, the base film BF may not serve as a support layer on which each of the functional layers FL and FL-1 and the anti-fingerprint layer AF are provided. When the thickness of the base film BF is greater than 100 μm, the entire thickness of the display device DD may be increased. Particularly, when the display device DD is folded as illustrated in FIGS. 1 to 4, as the thickness of the base film BF increases, the folding properties may be deteriorated.

Each of the functional layers FL and FL-1 may be provided on an upper portion of the base film BF. Each of the functional layers FL and FL-1 may be provided to include a single layer, or to include a plurality of sub-functional layers. In the window panels WP and WP-1 in exemplary embodiments, each of the functional layers FL and FL-1 may include a hard coating agent HCM and an anti-static agent ASM.

In the window panel WP in the exemplary embodiment illustrated in FIG. 6, the functional layer FL may be provided as a single layer including the hard coating agent HCM and the anti-static agent ASM.

In FIG. 6, FIG. 7, and the like, each of the hard coating agent HCM, the anti-static agent ASM, and the like is illustrated as being a particle having a circular cross-section. However, this is only exemplarily illustrated for convenience of explanation, and does not represent the actual shape of the hard coating agent HCM and the anti-static agent ASM. In an exemplary embodiment, each of the hard coating agent HCM and the anti-static agent ASM may respectively represent a hard coating composition and an anti-static composition, both in a solidified state, for example.

In FIG. 6, the hard coating agent HCM and the anti-static agent ASM are illustrated as being dispersed in the functional layer FL. However, unlike the case illustrated in FIG. 6, the hard coating agent HCM may be a matrix, and the anti-static agent ASM may be in the form of being dispersed in the hard coating agent HCM constituting the matrix. In the specification, the matrix is a portion corresponding to a main component in forming a layer, and may represent a medium.

In the functional layer FL provided as a single layer including both the hard coating agent HCM and the anti-static agent ASM, the weight ratio of the anti-static agent ASM based on the total weight of the functional layer FL may be about 5 wt % to about 15 wt %, for example.

When the weight ratio of the anti-static agent ASM is less than 5 wt %, the surface resistance in the window panel WP may be high. When the weight ratio of the anti-static agent ASM is greater than 15 wt %, the aggregation of the anti-static agent ASM may occur in the functional layer FL.

In an exemplary embodiment, the thickness of the functional layer FL including both the hard coating agent HCM and the anti-static agent ASM may be about 10 μm to about 50 μm. When the thickness of the functional layer FL is less than 10 μm, the window panel WP may not exhibit sufficient surface hardness for protecting the display module DM. When the thickness of the functional layer FL is greater than 50 μm, the window panel WP becomes thick, and thus, may not suitable for implementing the display device DD having a small thickness.

In the exemplary embodiment of the window panel WP illustrated in FIG. 6, the functional layer FL may be a single layer provided in a single process so as to include both the hard coating agent HCM and the anti-static agent ASM. That is, referring to FIG. 6, the anti-static agent ASM is included in an upper portion of the base film BF, and may be spaced apart from the display module DM.

In the exemplary embodiment of the window panel WP-1 illustrated in FIG. 7, the functional layer FL-1 may include a hard coating layer HC including the hard coating agent HCM and an anti-static layer AS including the anti-static agent ASM. That is, in an exemplary embodiment of the window panel WP-1, the anti-static layer AS and the hard coating layer HC may be provided as separate layers. The anti-static layer AS may not include the hard coating agent HCM.

In addition, in an exemplary embodiment of the window panel WP-1, the hard coating layer HC and the anti-static layer AS may be provided in separate processes. The hard coating layer HC may be first disposed on the base film BF and then the anti-static layer AS may be disposed on the hard coating layer HC.

In an exemplary embodiment, the hard coating layer HC may include the hard coating agent HCM but not the anti-static agent ASM, and the anti-static layer AS may include the anti-static agent ASM but not the hard coating agent HCM, for example. In an alternative exemplary embodiment, the anti-static layer AS may include the anti-static agent ASM but not the hard coating agent HCM, and the hard coating layer HC may include both the hard coating agent HCM and the anti-static agent ASM.

In the exemplary embodiment of the window panel WP-1 illustrated in FIG. 7, the thickness of the hard coating layer HC may be about 10 µm to about 50 µm, for example. When the thickness of the hard coating layer HC is less than 10 µm, for example, the window panel WP-1 may not exhibit sufficient surface hardness for protecting the display module DM. When the thickness of the hard coating layer HC is greater than 50 µm, for example, the window panel WP-1 becomes thick, and thus, may not be suitable for implementing the display device DD having a small thickness.

In an exemplary embodiment, the thickness of the anti-static layer AS may be about 1 µm or less, for example. Even when the anti-static layer AS is provided on the hard coating layer HC as a separate layer having a thickness of about 1 µm or less, good anti-static properties may be exhibited.

As illustrated in FIG. 7, when the functional layer FL-1 of the window panel WP-1 is provided as a plurality of layers, the anti-static layer AS is provided as a separate layer from the hard coating layer HC, and may be disposed on an upper surface of the hard coating layer HC and spaced apart from the display module DM. The anti-static layer AS may include a polymer resin together with the anti-static agent ASM. In an exemplary embodiment, the anti-static layer AS may include an acrylic resin as a matrix, and include the anti-static agent ASM sprayed on the acrylic resin, for example.

The hard coating agent HCM used in each of the functional layers FL and FL-1 may include a hard coating composition including at least one among an organic-based composition, an inorganic-based composition, and an organic-inorganic hybrid composition. In an exemplary embodiment, the hard coating agent HCM may include a hard coating composition including at least one among an acrylate-based compound, a siloxane compound, or a silsesquioxane compound, for example. In addition, the hard coating agent HCM may be provided by further including an inorganic particle.

In the hard coating composition, the inorganic particle may be used for improving the hardness of each of the functional layers FL and FL-1. In an exemplary embodiment, the inorganic particle may include at least one among $SiO_2$, $TiO_2$, $Al_2O_3$, $ZrO_2$, ZnO, AlN, and $Si_3N_4$, for example. The inorganic particle may be surface-treated with an organic material such as silane to increase the degree of dispersion in the hard coating composition.

The anti-static agent ASM may be provided from an anti-static composition including at least one of a metal-based compound and an ionic liquid material. In an exemplary embodiment, the metal-based compound used as the anti-static agent ASM may include $Sb_2O_5$, or $SnO_2$, or the like, for example. In an exemplary embodiment, the ionic liquid material used as the anti-static agent ASM may include ammonium (NH4+), phosphonium (PH4+), Imidazolium, Pyridinium, or lithium ions (Li+), or the like, for example.

In an exemplary embodiment, the anti-static agent ASM used in each of the functional layers FL and FL-1 may include at least one among the ionic liquid materials, or may include both the ionic liquid material and the metal-based compound. In an exemplary embodiment, the anti-static agent ASM may include at least one among $Sb_2O_5$ and $SnO_2$, and lithium ions (Li+), for example. In an alternative exemplary embodiment, the anti-static agent ASM may include only lithium ions (Li+).

When the anti-static agent ASM includes both the ionic liquid material and the metal-based compound, the content of the metal-based compound may be less than the content of the ionic liquid material in the anti-static agent ASM. This is due to that fact that "Sb" metal may cause environmental harm in the case of $Sb_2O_5$, and "Sn" may cause an aggregation phenomenon when used together with a hard coating composition forming the hard coating agent HCM.

That is, the window panels WP and WP-1 in exemplary embodiments described with reference to FIGS. 6 and 7 include the functional layer FL including both the anti-static agent ASM and the hard coating agent HCM, or the functional layer FL-1 including the anti-static layer AS which is provided as a separate layer from the hard coating layer HC including the hard coating agent HCM and includes the anti-static agent ASM, and thus may exhibit improved anti-static properties.

The window panels WP and WP-1 in exemplary embodiments may have a surface resistance greater than about $10^9$ ohms square (Ω/sq) and less than about $10^{13}$ Ω/sq. When the window panels WP and WP-1 have a surface resistance of $10^9$ Ω/sq or less or $10^{13}$ Ω/sq or greater, the sensing performance of the input sensing unit TP disposed on a lower portion of each of the window panels WP and WP-1 may be affected. That is, when the window panels WP and WP-1 have a surface resistance of $10^9$ Ω/sq or less or $10^{13}$ Ω/sq or greater, the sensitivity of a touch sensed by the input sensing unit TP may be deteriorated, so that touch noise may be increased. The touch noise may refer to a phenomenon in which the input sensing unit TP is not capable of sensing a touch and the like applied externally.

Each of the window panels WP and WP-1 in exemplary embodiments may further include the anti-fingerprint layer AF. The anti-fingerprint layer AF may be disposed on an upper portion of each of the functional layers FL and FL-1. The anti-fingerprint layer AF may be provided from a fingerprint prevention composition including a fluorine-based additive. In an exemplary embodiment, the fingerprint prevention composition may include an acrylate-based compound and the fluorine-based additive, for example. In an exemplary embodiment, the anti-fingerprint layer AF may be a layer including a fluorine-containing silane compound in which a silane portion and a fluorinated carbon portion are linked by an alkyl chain, for example.

Although not illustrated in the drawings, each of the window panels WP and WP-1 may further include an additional sub-functional layer in addition to each of the functional layers FL and FL-1 and the anti-fingerprint layer AF. In an exemplary embodiment, the window panel WP may include a sub-functional layer such as a scattering prevention layer, a contamination prevention layer, and the like, for example.

In the display device DD of an exemplary embodiment, the display panel DP may be a light emission type display panel. In an exemplary embodiment, the display panel DP may be an organic electroluminescence display panel or a quantum dot light emitting display panel, for example. However, the invention is not limited thereto.

Figure 8:
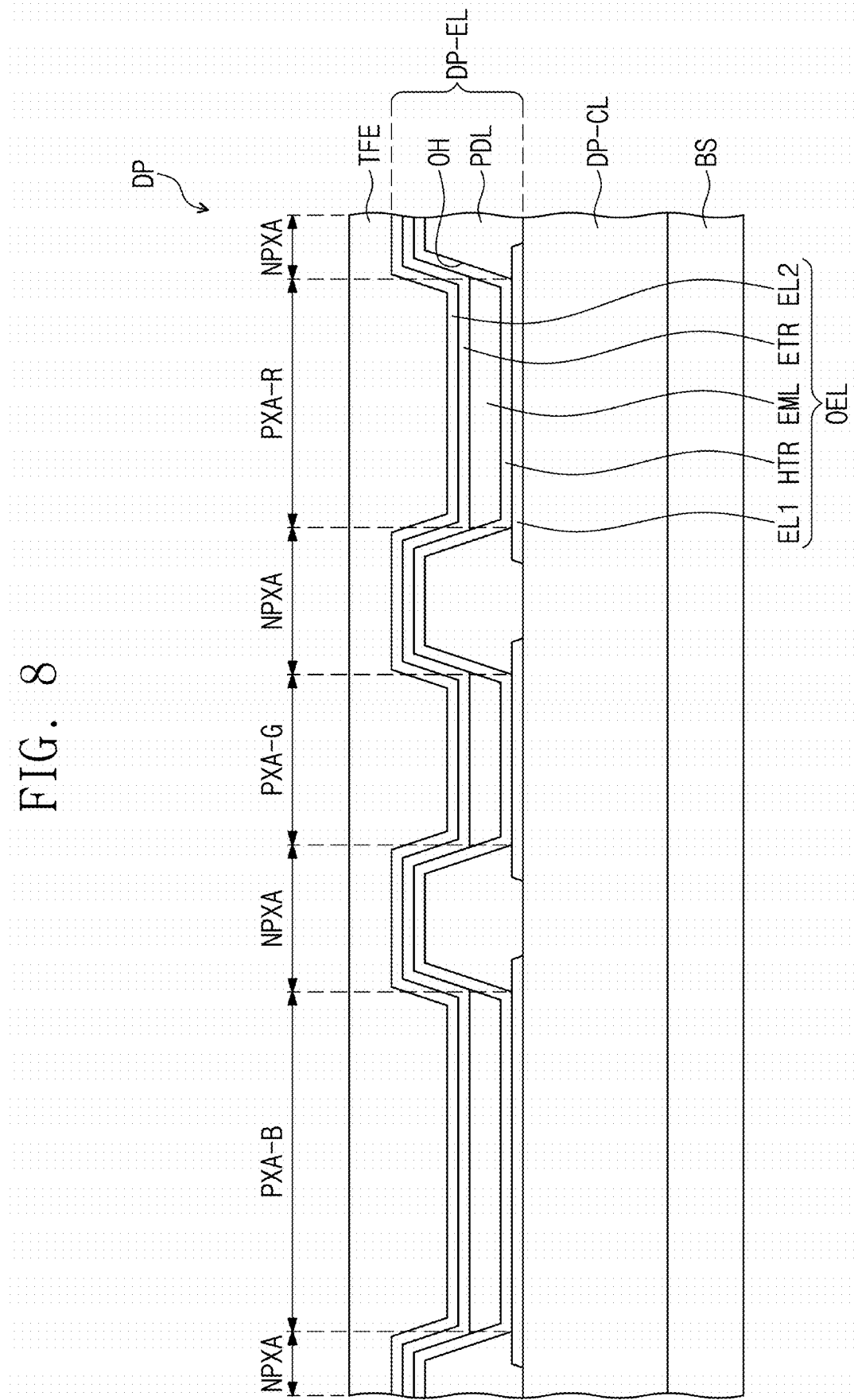
FIG. 8 is a cross-sectional view of an exemplary embodiment of a display panel according to the invention.

FIG. 8 is a cross-sectional view of an exemplary embodiment of the display panel DP according to the invention. Referring to FIGS. 5 to 8, the display panel DP may include a base substrate BS, a circuit layer DP-CL and a display element layer DP-EL which are provided on the base substrate BS, and an encapsulation layer TFE disposed on the display element layer DP-EL. In an exemplary embodiment, the base substrate BS, the circuit layer DP-CL, the display element layer DP-EL, and the encapsulation layer TFE may be sequentially laminated in the third direction axis DR3 direction.

The display element layer DP-EL may include a pixel defining layer PDL and a plurality of light emitting devices OEL disposed in an opening OH defined in the pixel defining layer PDL.

The base substrate BS may be a member which provides a base surface on which the display element layer DP-EL is disposed. In an exemplary embodiment, the base substrate BS may be a glass substrate, a metal substrate, a plastic substrate, or the like. However, the invention is not limited thereto, and the base substrate BS may be an inorganic layer, an organic layer, or a composite material layer.

In an exemplary embodiment, the circuit layer DP-CL may be disposed on the base substrate BS, and the circuit layer DP-CL may include a plurality of transistors (not shown). Each of the transistors (not shown) may include a control electrode, an input electrode, and an output electrode. In an exemplary embodiment, the circuit layer DP-CL may include a switching transistor and a driving transistor for driving light emitting devices OEL of the display element layer DP-EL, for example.

The pixel defining layer PDL may include a polymer resin. In an exemplary embodiment, the pixel defining layer PDL may be provided by including a polyacrylate-based resin or a polyimide-based resin, for example. Also, the pixel defining layer PDL may be provided by further including an inorganic material in addition to the polymer resin. The pixel defining layer PDL may be provided by including a light absorbing material, or may be provided by including a black pigment or a black dye. Also, the pixel defining layer PDL may include an inorganic material. In an exemplary embodiment, the pixel defining layer PDL may be provided by including silicon nitride (SiNx), silicon oxide (SiOx), silicon oxide (SiOxNy), or the like, for example. The pixel defining layer PDL may define light emitting regions PXA-B, PXA-G, and PXA-R. The light emitting regions PXA-B, PXA-G, and PXA-R and a non-light emitting region NPXA may be separated by the pixel defining layer PDL.

The plurality of light emitting devices OEL separated by the pixel defining layer PDL may emit light of different wavelength regions. However, the invention is not limited thereto. The light emitting devices OEL spaced apart from each other may emit light of the same wavelength region, or at least one thereof may emit light of a different wavelength region.

The light emitting device OEL may include a first electrode EL1 and a second electrode EL2 facing each other, and a light emitting layer EML disposed between the first electrode EL1 and the second electrode EL2. In addition, the light emitting device OEL may include a hole transport region HTR disposed between the first electrode EL1 and the light emitting layer EML, and an electron transport region ETR disposed between the light emitting layer EML and the second electrode EL2. The hole transport region HTR may include a hole injection layer adjacent to the first electrode EL1 and a hole transport layer disposed between the hole injection layer and the light emitting layer EML, and the electron transport region ETR may include an electron injection layer adjacent to the second electrode EL2 and an electron transport layer disposed between the light emitting layer EML and the electron injection layer.

The light emitting layer EML may have a single layer structure having a single layer including a single material, a single layer structure having a single layer including a plurality of different materials, or a multilayer structure having a plurality of layers including a plurality of different materials.

In the display device DD of an exemplary embodiment, when the display panel DP is an organic electroluminescence display panel, the light emitting layer EML may include an anthracene derivative, a pyrene derivative, a fluoranthene derivative, a chrysene derivative, a dihydrobenz anthracene derivative, or a triphenylene derivative. Specifically, the light emitting layer EML may include an anthracene derivative or a pyrene derivative.

When the display panel DP is an organic electroluminescence display panel, the light emitting layer EML may include a host and a dopant. In an exemplary embodiment, the light emitting layer EML may include, as a host material, at least one among Bis[2-(diphenylphosphino)phenyl] ether oxide ("DPEPO"), 4,4'-Bis(carbazol-9-yl)biphenyl ("CBP"), 1,3-Bis(carbazol-9-yl)benzene ("mCP"), 2,8-Bis (diphenylphosphoryl)dibenzo[b,d]furan ("PPF"), 4,4',4"-Tris(carbazol-9-yl)-triphenylamine ("TcTa"), and 1,3,5-tris (N-phenylbenzimidazole-2-yl)benzene ("TPBi"), for example. However, the invention is not limited thereto. In an exemplary embodiment, tris(8-hydroxyquinolino)aluminum ($Alq_3$), 4,4'-bis(N-carbazolyl)-1,1'-biphenyl ("CBP"), poly (N-vinylcabazole ("PVK"), 9,10-di(naphthalene-2-yl)anthracene ("ADN"), 4,4',4"-Tris(carbazol-9-yl)-triphenylamine ("TCTA"), 1,3,5-tris(N-phenylbenzimidazole-2-yl) benzene (TPBi), 3-tert-butyl-9,10-di(naphth-2-yl) anthracene ("TBADN"), distyrylarylene ("DSA"), 4,4-bis (9-carbazolyl)-2,2"-dimethyl-biphenyl ("CDBP"), 2-M ethyl-9,10-bis(naphthalen-2-yl)anthracene ("MADN"), Hexaphenyl cyclotriphosphazene ("CP1"), 1,4-Bis(triphenylsilyl)benzene ("UGH2"), Hexaphenylcyclotrisiloxane ($DPSiO_3$), Octaphenylcyclotetra siloxane ($DPSiO_4$), 2,8-Bis (diphenylphosphoryl)dibenzofuran ("PPF"), or the like may be used as a host material, for example.

In addition, the light emitting layer EML may include, as a dopant material, a styryl derivative (for example, 1,4-bis [2-(3-N-ethylcarbazoryl)vinyl] benzene ("BCzVB"), 4-(di-p-tolylamino)-4'-[(di-p-tolylamino)styryl] stilbene ("DPAVB"), and N-(4-((E)-2-(6-((E)-4-(diphenylamino) styryl)naphthalen-2-yl)vinyl)phenyl)-N-phenylbenzenamine ("N-BDAVBi"), perylene and a derivative thereof (for example, 2,5,5,8,11-tetra-t-butylperylene ("TBP")), pyrene and a derivative thereof (for example, 1,1-dipyrene, 1,4-dipyrenylbenzene, and 1,4-Bis(N, N-Diphenylamino) pyrene), or the like.

When the display panel DP in an exemplary embodiment is a quantum dot light emitting display panel, the display panel DP may include a quantum dot material in the light emitting layer EML. A core of the quantum dot may be selected from a Group II-VI compound, a Group III-V compound, a Group IV-VI compound, a Group IV element, a Group IV compound, and a combination thereof.

The Group II-VI compound may include a binary compound including CdSe, CdTe, ZnS, ZnSe, ZnTe, ZnO, HgS, HgSe, HgTe, MgSe, MgS, and a combination thereof, a ternary compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound including HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may include a binary compound including GaN, GaP, GaAs, GaSb, AlN, AlP, AlAs, AlSb, InN, InP, InAs, InSb, and a combination thereof, a ternary compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof, and a quaternary compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may include a binary compound including SnS, SnSe, SnTe, PbS, PbSe, PbTe, and a combination thereof, a ternary compound including SnSeS, SnSeTe, SnSTe, PbSeS, PbSeTe, PbSTe, SnPbS, SnPbSe, SnPbTe, and a combination thereof, and a quaternary compound including SnPbSSe, SnPbSeTe, SnPbSTe, and a combination thereof. The Group IV element may include Si, Ge, and a combination thereof. The IV group compound may be a binary compound including SiC, SiGe, and a combination thereof.

At this time, a binary compound, a ternary compound, or a quaternary compound may be present in a particle with a uniform concentration distribution, or may be in the same particle with a partially different concentration. In addition, a quantum dot may have a core-shell structure in which one quantum dot surrounds another quantum dot. An interface between a core and a shell may have a concentration gradient in which the concentration of an element in the shell becomes lower toward the center.

In some exemplary embodiments, a quantum dot may have a core-shell structure including a core having nanocrystals and a shell surrounding the core which are described above. The shell of the quantum dot may serve as a protection layer to prevent the chemical deformation of the core so as to maintain semiconductor properties, and/or a charging layer to impart electrophoresis properties to the quantum dot. The shell may be a single layer or multiple layers. An interface between a core and a shell may have a concentration gradient in which the concentration of an element in the shell becomes lower toward the center. An example of the shell of the quantum dot may be a metal or non-metal oxide, a semiconductor compound, or a combination thereof.

In an exemplary embodiment, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, for example. However, the invention is not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like. However, the invention is not limited thereto.

A quantum dot may have a full width of half maximum ("FWHM") of a light emission wavelength spectrum of about 45 nanometers (nm) or less, preferably about 40 nm or less, more preferably about 30 nm or less, and color purity or color reproducibility may be improved in the above range. In addition, light emitted through such quantum dot is emitted in all directions so that a wide viewing angle may be improved.

In addition, although the form of a quantum dot is not particularly limited as long as it is a form commonly used in the art, more specifically, a quantum dot in the form of spherical, pyramidal, multi-arm, or cubic nanoparticles, nanotubes, nanowires, nanofibers, nanoparticles, and the like may be used.

A quantum dot may control the color of emitted light according to the particle size thereof. Accordingly the quantum dot may have various light emission colors such as blue, red, green, and the like.

On the light emitting device OEL, the encapsulation layer TFE may be disposed, and the encapsulation layer TFE may be disposed on the second electrode EL2. In an exemplary embodiment, the encapsulation layer TFE may be directly disposed on the second electrode EL2. The encapsulation layer TFE may be a single layer or a plurality of layers laminated.

The display panel DP may include the non-light emitting region NPXA and the light emitting regions PXA-B, PXA-G, and PXA-R. Each of the light emitting regions PXA-B, PXA-G, and PXA-R may be a region in which light generated from each of the light emitting devices OEL separated by the pixel defining layer PDL is emitted. The light emitting regions PXA-B, PXA-G, and PXA-R may be spaced apart from each other in a plan view.

The light emitting regions PXA-B, PXA-G, and PXA-R may be classified into a plurality of groups according to the color of light generated from the light emitting devices OEL. In the display panel DP of an exemplary embodiment illustrated in FIG. 8, three light emitting regions PXA-B, PXA-G, and PXA-R which emit blue light, green light, and red light respectively are exemplarily illustrated. However, the invention is not limited thereto.

Figure 9:
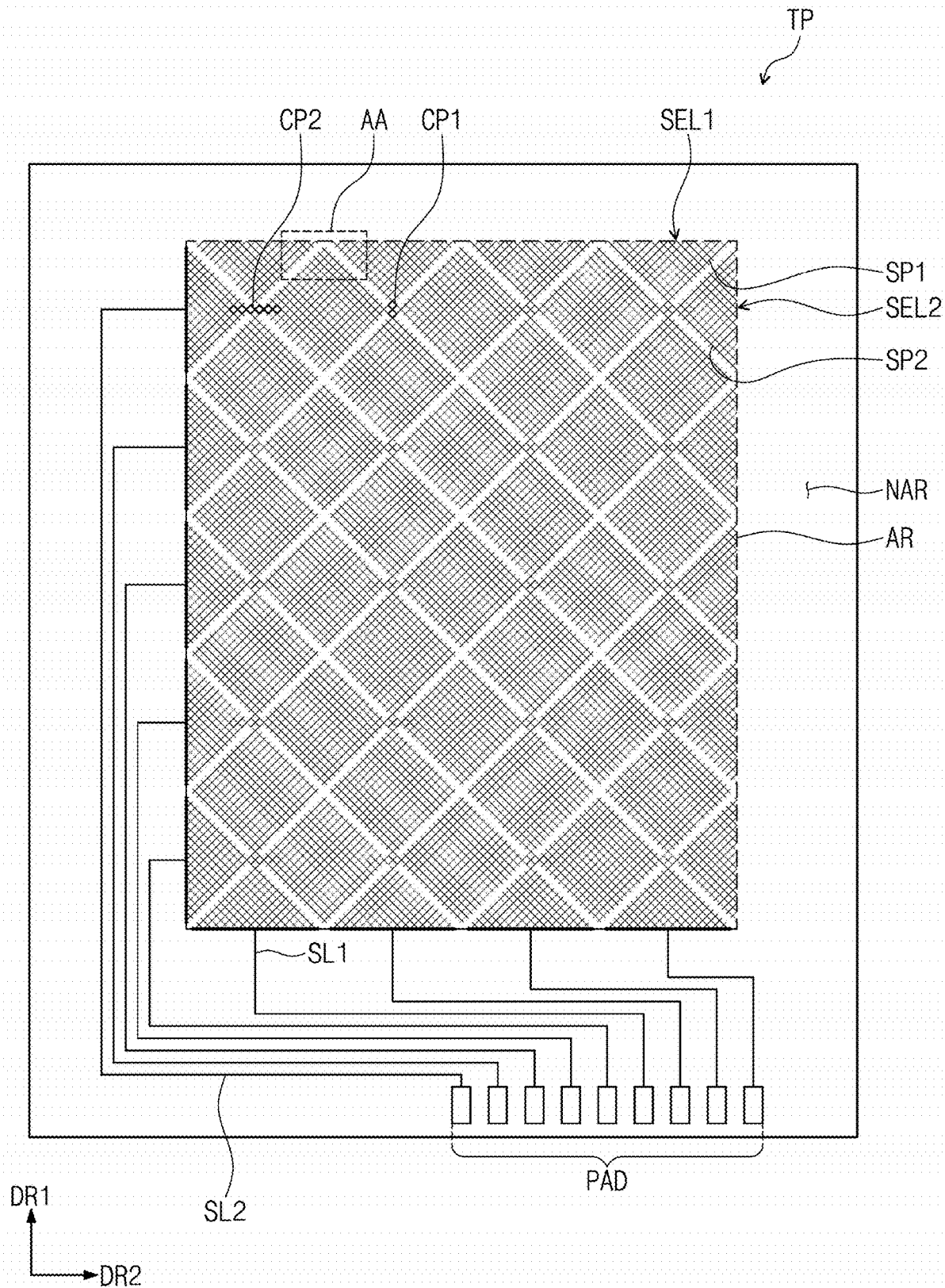
FIG. 9 is a plan view of an exemplary embodiment of an input sensing unit according to the invention.
Figure 10:
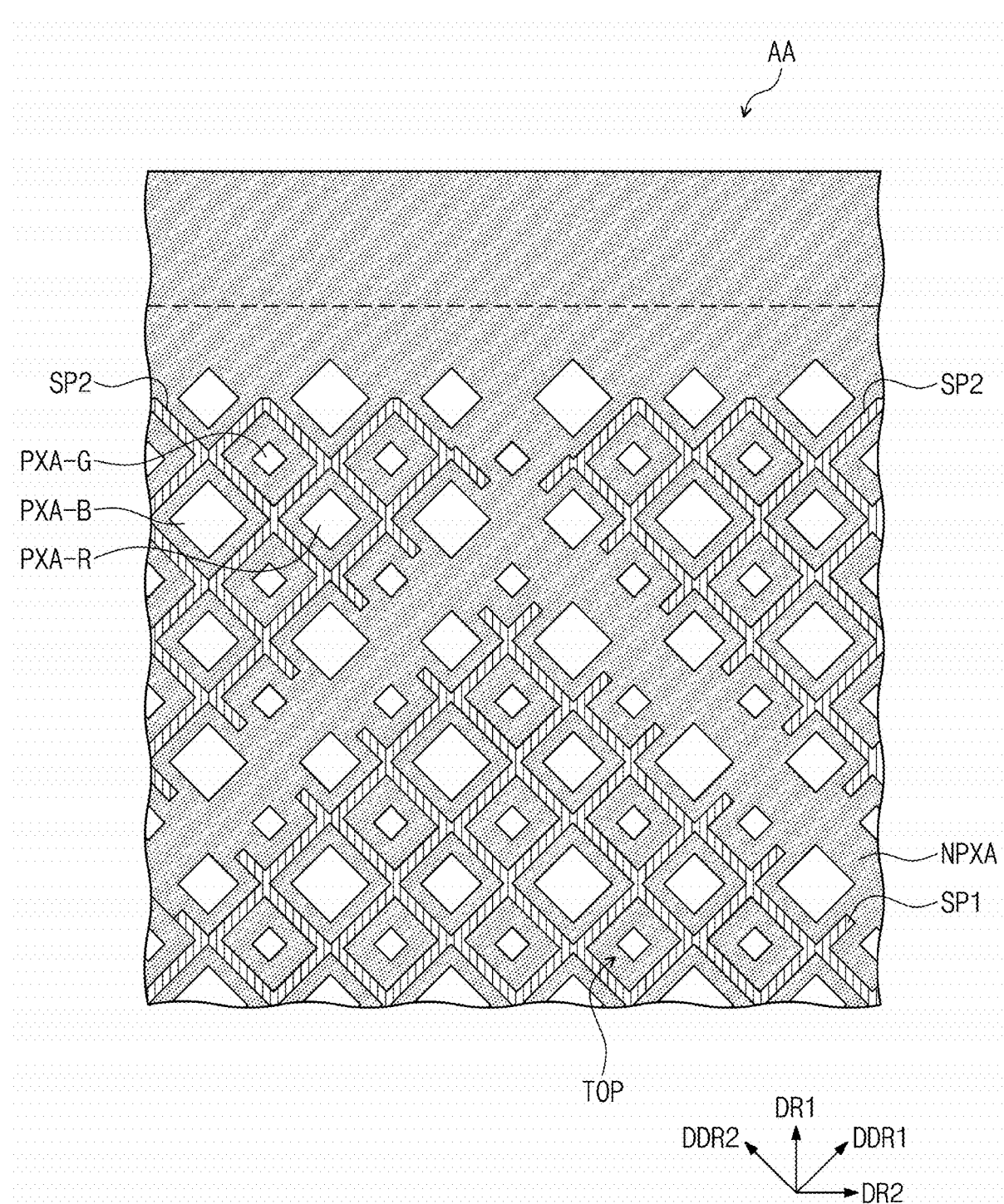
FIG. 10 is an enlarged view of region AA of FIG. 9.

FIG. 9 is a view showing an exemplary embodiment of a planar configuration of the input sensing unit included in the display device DD illustrated in FIG. 5. FIG. 10 is an enlarged view of region AA illustrated in FIG. 9.

Referring to FIG. 9, the input sensing unit TP may include a plurality of sensing electrodes SEL1 and SEL2, a plurality of wirings SL1 and SL2, and a plurality of pads. As illustrated in FIG. 5, the input sensing unit TP may be disposed on the display panel DP. In an exemplary embodiment, the input sensing unit TP may be directly disposed on the encapsulation layer TFE. In an exemplary embodiment, the sensing electrodes SEL1 and SEL2, the wirings SL1 and SL2, and the pads PAD may be disposed on the encapsulation layer TFE, for example.

The sensing electrodes SEL1 and SEL2 and the wirings SL1 and SL2 may have a single-layered structure or a multi-layered structure laminated in an upward direction. A conductive layer of a multi-layered structure may include at least two layers of transparent conductive layers and metal layers. A conductive layer of a multi-layered structure may include metal layers including different metals. In an exemplary embodiment, the transparent conductive layer may include indium tin oxide ("ITO"), indium zinc oxide ("IZO"), zinc oxide (ZnO), indium tin zinc oxide ("ITZO"), PEDOT, metal nanowires, graphene, or the like, for example. In an exemplary embodiment, the metal layer may include molybdenum, silver, titanium, copper, aluminum, or an alloy thereof, for example.

The input sensing unit TP may include an active region AR and a non-active region NAR surrounding the active region AR. The sensing electrodes SEL1 and SEL2 may be disposed on the active region AR and the pads PAD may be disposed on the non-active region NAR. The wirings SL1 and SL2 may be connected to the sensing electrodes SEL1 and SEL2, and may be extended to the non-active region NAR and connected to the pads PAD.

Although not illustrated, the pads PAD may be connected to a driving unit for driving the input sensing unit TP through a flexible printed circuit board (not shown).

The sensing electrodes SEL1 and SEL2 may be extended in the first direction axis DR1 direction and include a plurality of first sensing electrodes SEL1 arranged in the second direction axis DR2 direction, and may be extended in the second direction axis DR2 direction and include a plurality of second sensing electrodes SEL2 arranged in the first direction axis DR1 direction. The wirings SL1 and SL2 may include a plurality of first signal wirings SL1 connected to the first sensing electrodes SEL1 and a plurality of second signal wirings SL2 connected to the second sensing electrodes SEL2.

The first sensing electrodes SEL1 may be extended so as to cross the second sensing electrodes SEL2 while being insulated therefrom. The first sensing electrode SEL1 and the second sensing electrode SEL2 may have a mesh shape. Capacitance may be provided by the first sensing electrodes SEL1 and the second sensing electrode SEL2.

Each of the first sensing electrodes SEL1 may include a plurality of first sensor units SP1 arranged in the first direction axis DR1 direction and a plurality of first connection units CP1 for connecting the first sensor units SP1. The first sensor units SP1 may have a mesh shape. Each of the first connection units CP1 is disposed between two first sensor units SP1 adjacent to each other, and may electrically connect the two first sensor units SP1.

Each of the second sensing electrodes SEL2 may include a plurality of second sensor units SP2 arranged in the second direction axis DR2 direction and a plurality of second connection units CP2 for connecting the second sensor units SP2. The second sensor unit SP2 may have a mesh shape. Each of the second connection units CP2 is disposed between two second sensor units SP2 adjacent to each other, and may electrically connect the two second sensor units SP2.

The first sensor units SP1 and the second sensor units SP2 are spaced apart from each other without overlapping each other, and may be arranged alternately with each other. The second connection units CP2 may be extended so as to cross the first connection units CP1 while being insulated therefrom. The first and second sensor units SP1 and SP2 and the second connection units CP2 may be disposed in the same layer. The first connection units CP1 may be disposed in a different layer from the first and second sensor units SP1 and SP2 and the second connection units CP2.

Although not illustrated, an insulation layer may be disposed between the first connection units CP1 and the second connection units CP2. The first connection units CP1 may be connected to the first sensor units SP1 through contact holes defined in the insulation layer. The second connection units CP2 may be unitary with the second sensor units SP2.

Referring to FIG. 10, the plurality of light emitting regions PXA-B, PXA-G, and PXA-R may respectively correspond to the light emitting regions PXA-B, PXA-G, and PXA-R of the display panel DP illustrated in FIG. 8. The light emitting regions PXA-B, PXA-G, and PXA-R may display blue, green, and red, respectively. However, the invention is not limited thereto. In other exemplary embodiments, light emitting regions for displaying magenta, cyan, or white may be further included, for example.

The light emitting regions PXA-B, PXA-G, and PXA-R may have different sizes depending on the color they display. In an exemplary embodiment, a blue light emitting region PXA-B may be bigger than a red light emitting region PXA-R, and the red light emitting region PXA-R may be bigger than a green light emitting region PXA-G, for example.

Each of the light emitting regions PXA-B, PXA-G, and PXA-R may have a rhombic shape, but is not limited thereto. The light emitting regions PXA-B, PXA-G, and PXA-R may have various shapes such as circular and polygonal shapes. The light emitting regions PXA-B, PXA-G, and PXA-R may be arranged in a first diagonal direction axis DDR1 and a second diagonal direction axis DDR2.

The first diagonal direction axis DDR1 may be defined as a direction intersecting the first direction axis DR1 and the second direction axis DR2 in a plan view defined by the first direction axis DR1 and the second direction axis DR2. The second diagonal direction axis DDR2 may be defined as a direction intersecting the first diagonal direction axis DDR1 in a plan view defined by the first direction axis DR1 and the second direction axis DR2. Illustratively, the first direction axis DR1 and the second direction axis DR2 may vertically intersect with each other, and the first diagonal direction axis DDR1 and the second diagonal direction axis DDR2 may vertically intersect with each other.

The first and second sensor units SP1 and SP2 having a mesh shape may overlap the non-light emitting region NPXA. Openings TOP defined by a mesh structure have a rhombic shape corresponding to the shapes of the light emitting regions PXA-B, PXA-G, and PXA-R, and may have a size corresponding to the light emitting regions PXA-B, PXA-G, and PXA-R.

Since the first and second sensor units SP1 and SP2 are disposed in the non-light emitting region NPXA, light generated from the light emitting regions PXA-B, PXA-G, and PXA-R may be emitted normally without being affected by the first and second sensor units SP1 and SP2.

Hereinafter, in the description of Table 1 to Table 3, an exemplary embodiment of a window member and whether there is an improvement in the anti-static properties and touch noise of a display device of an exemplary embodiment which includes the window member will be described based on the experimental results compared to those of Comparative Examples.

Table 1 below shows the results of evaluating the anti-static properties and the degree of touch noise of an exemplary embodiment of a display device compared with those of display devices of Comparative Examples.

TABLE 1

| Classification | Comparative Example 1-1 | Comparative Example 1-2 | Comparative Example 1-3 | Comparative Example 1-4 | Example 1-1 | Example 1-2 |
|---|---|---|---|---|---|---|
| Peeling electrification voltage (V) | 100 or less | 200 or greater | 20-50 | 20-50 | 20-50 | 20-50 |
| Surface resistance (Ω/sq) | $10^{10}$ | $10^{13}$ or greater | $10^{10}$ | $10^{10}$ | $10^{10}$ | $10^{10}$ |
| Touch noise | ±50 | ±278 | ±300 | ±350 | ±50 | ±50 |

Table 1 shows the results of evaluating the anti-static properties of window panels used in display devices of Examples and Comparative Examples and the touch quality of the display devices. In Comparative Example 1-1, a glass substrate was used as a window panel, and in Comparative Example 1-2, a window panel not including an anti-static agent was used. In a window panel used in Comparative Example 1-3, an anti-static layer containing an anti-static agent was disposed between a base film and a hard coating layer. In a window panel used in Comparative Example 1-4, an anti-static layer containing an anti-static agent was disposed on a lower portion of a base film.

Example 1-1 is a case in which a window panel has the configuration of the window panel WP in an exemplary embodiment illustrated in FIG. 6, and Example 1-2 is a case in which a window panel has the configuration of the window panel WP-1 in an exemplary embodiment illustrated in FIG. 7.

The peeling electrification voltage presented as the evaluation results in Table 1 was obtained by attaching a protective tape on the window panel of each of Comparative Examples or Examples and measuring the surface potential value of the window panel when peeling was performed at a rate of about 40 meters per minute (m/min) using a high-speed peeling tester.

The surface resistance value is a value obtained by measuring the surface of the window panel of each of Comparative Examples and Examples using a surface resistance meter. The surface resistance value is the average of values obtained by measuring four points or more with the surface resistance meter.

The evaluation results of touch noise shown in Table 1 were obtained by relatively evaluating the touch sensitivity of the display device of each of Comparative Examples and Examples. Based on a value when a touch was recognized normally, when the absolute value was less than 100, it was evaluated as having a normal touch sensitivity.

The display devices used in the touch noise evaluation of Comparative Example 1-1 to Comparative Example 1-4, and Example 1-1 and Example 1-2 had the same configurations for all components except for the window panel. That is, the touch noise value of Comparative Example 1-1 is for a display device using a glass substrate as a window panel, and the touch noise value of Comparative Example 1-2 is for a display device including a window panel not containing an anti-static agent. The touch noise value of Comparative Example 1-3 is for a display device including a window panel in which an anti-static layer containing an anti-static agent is disposed between a base film and a hard coating layer, and the touch noise value of Comparative Example 1-4 is for a display device including a window panel in which an anti-static layer including an anti-static agent is disposed on a lower portion of a base film. Also, the touch noise value of Example 1-1 is for an exemplary embodiment of a display device including the window panel WP illustrated in FIG. 6, and the touch noise value of Example 1-2 is for an exemplary embodiment of a display device including the window panel WP-1 illustrated in FIG. 7.

In the evaluation results shown in Table 1, the peeling electrification voltage and the surface resistance were measured in the window panel state, and the touch noise was measured in the display device state.

In the case of Comparative Example 1-1, the peeling electrification voltage was 100 volts (V) or lower and the surface resistance was $10^{10}$ Ω/sq, so that good anti-static properties were exhibited. Furthermore, in the touch noise evaluation, the absolute value was 50, so that it may be seen that good touch sensitivity was exhibited. This is determined to be due to the fact that a glass substrate instead of a base film of a polymer material was used as the window panel used in Comparative Example 1-1, and that the glass substrate itself has a low surface resistance value, thereby exhibiting good anti-static performance without being subjected to a separate anti-static treatment. This is also determined to be due to the fact that the anti-static properties of the window panel did not affect the operation of the input sensing unit disposed on a lower portion, so that there was not much touch noise generated in the display device.

In comparison, in the case of Comparative Example 1-2, the peeling electrification voltage was 200 V or higher and the surface resistance was $10^{13}$ Ω/sq or higher, so that it may be seen that the anti-static properties were deteriorated. Also, the touch noise value had an absolute value of 278, so that it may be seen that the touch sensitivity was deteriorated. This is determined to be due to the fact that the window panel used in Comparative Example 1-2 had low anti-static performance, so that the anti-static properties of the window panel affected the operation of the input sensing unit disposed on the lower portion, causing the generation of a touch noise phenomenon.

In the cases of Comparative Example 1-3 and Comparative Example 1-4, the peeling electrification voltage was 20-50 V and the surface resistance was $10^{10}$ Ω/sq, so that good anti-static properties were exhibited in the window panel state. This is determined to be due to the fact that an anti-static agent was contained in the window panel. However, in the touch noise evaluation, the display device used in each of Comparative Example 1-3 and Comparative Example 1-4 had a high touch noise value.

In comparison, when compared with Comparative Example 1-2, Example 1-1 and Example 1-2 further included an anti-static agent in the window panel, so that a low peeling electrification voltage and a low surface resistance value were exhibited. That is, compared with Comparative Example 1-2, improved anti-static properties were exhibited. Furthermore, in the touch noise evaluation, the absolute value was 50 or less, so that it may be seen that good touch sensitivity was exhibited. There are differences between Example 1-1 and Example 1-2 in that Example 1-1 included an anti-static agent and a hard coating agent in a single layer whereas Example 1-2 included an anti-static layer including an anti-static agent as a separate layer from a hard coating layer. However, Example 1-1 and Example 1-2 had a similar anti-static effect.

When comparing the results of Example 1-1 and Example 1-2 with the results of Comparative Example 1-2, it may be confirmed that when a window panel including an anti-static agent was used, the anti-static properties of the window panel itself were improved, so that a touch noise phenomenon which may be caused by a window panel was reduced.

When comparing the results of Example 1-1 and Example 1-2 with the results of Comparative Example 1-3 and Comparative Example 1-4, the anti-static properties of the window panels themselves were all excellent. However, the touch noise evaluation of the display devices exhibited different results. That is, when an anti-static agent was applied together with a hard coating agent to form a functional layer (in the case of Example 1-1), or when an anti-static layer including an anti-static agent was disposed on an upper layer of a hard coating layer (in the case of Example 1-2), it may be confirmed that the touch noise phenomenon was significantly alleviated when compared with a case in which an anti-static layer was disposed on a lower portion of a hard coating agent (in the case of Comparative Example 1-3) or an anti-static layer was disposed on a lower portion of a base film (in the case of Comparative Example 1-4).

That is, when comparing the results of Example 1-1 and Example 1-2 with the results of Comparative example 1-3 and Comparative Example 1-4, it may be determined that when a layer including an anti-static agent was relatively spaced apart from an input sensing unit, a touch noise phenomenon is alleviated. In the case of Example 1-2, the anti-static layer was disposed as a separate layer on an upper portion of the hard coating layer, and thus, was sufficiently spaced apart from the input sensing unit. Therefore, the anti-static effect of the anti-static layer did not affect the input sensing unit while the window panel maintained excellent anti-static properties, so that the effect of alleviating touch noise was exhibited.

In the case of Example 1-1, the anti-static agent was mixed with the hard coating agent to form a single functional layer. In this case, the ratio of the anti-static layer to the entire functional layer was relatively small when compared to those of Comparative Examples 1-3 and Comparative Examples 1-4 in which the anti-static layer was provided as a separate layer. Therefore, it may be determined that the anti-static agent did not affect the input sensing unit when compared with Comparative Example 1-3 or Comparative Example 1-4, so that the effect of alleviating touch noise problem was exhibited.

Table 2 below shows the peeling electrification voltage properties according to the surface resistance value of the window panel WP in an exemplary embodiment and the degree of touch noise in a display device including the window panel WP in an exemplary embodiment. An example in Table 2 was a case having the configuration of the window panel WP in an exemplary embodiment illustrated in FIG. 6, in which the surface resistance value and the peeling electrification voltage were measured in the window panel state and the touch noise was evaluated in the display device state including the window panel WP in an exemplary embodiment. Each of Comparative Example 2-1 and Comparative Example 2-2 shown in Table 2 has the same configuration of a window panel as that of Example 1, but has different surface resistance values.

TABLE 2

| Classification | Comparative Example 2-1 | Comparative Example 2-2 | Example |
|---|---|---|---|
| Surface resistance ($\Omega$/sq) | $10^{13}$ | $10^{9}$ | $10^{10}$-$10^{11}$ |
| Peeling electrification voltage (V) | 100 or less | 20-50 | 20-50 |
| Touch noise | ±300 | ±300 | ±50 |

That is, when referring to the results of Table 2, when the surface resistance value of a window panel in an exemplary embodiment was $10^{13}$ $\Omega$/sq or greater or $10^{9}$ $\Omega$/sq or less, it may be seen that the touch noise phenomenon appeared higher than the reference value 100 when compared with those of Examples. Accordingly, when referring to the results of Table 2, the surface resistance value of the window panel in an exemplary embodiment may be $10^{9}$ $\Omega$/sq or greater and $10^{13}$ $\Omega$/sq or less.

Table 3 below shows the results of the reliability evaluation of the window panel WP in an exemplary embodiment and a display device including the same. The reliability evaluation was performed by evaluating the peeling electrification voltage, surface resistance value, and touch noise after the reliability test at room temperature and high temperature/high humidity. An example used for the reliability evaluation of Table 3 was a case having the configuration of the window panel WP in an exemplary embodiment illustrated in FIG. 6, in which the surface resistance value and the peeling electrification voltage were measured in the window panel state and the touch noise was evaluated in the display device state including the window panel WP in an exemplary embodiment. In an exemplary embodiment of a window panel which was used in the reliability evaluation of Table 3, lithium ions were used as an anti-static agent. The conditions of reliability 1 were 60 degrees Celsius (° C.)/93 percent (%) humidity, and the conditions of reliability 2 were 85° C./85% humidity.

TABLE 3

| Classification | Room temperature (RT) | Reliability 1 | Reliability 2 |
|---|---|---|---|
| Surface resistance ($\Omega$/sq) | $10^{10}$-$10^{11}$ | $10^{10}$ | $10^{11}$ |
| Peeling electrification voltage (V) | 20-50 | 20-50 | 20-50 |
| Touch noise | ±50 | ±50 | ±50 |

Referring to the results of Table 3, the window panel including lithium ions as an anti-static agent exhibited good anti-static properties even after having been left under the reliability conditions, and a display device including the window panel also exhibited good touch noise properties even after having been left under the reliability conditions.

In the display device of an exemplary embodiment described above with reference to FIGS. 1 to 10, the window panel includes a functional layer including an anti-static agent. In particular, by providing a functional layer including an anti-static agent and a hard coating agent as a single layer on a base film, or by disposing a functional layer including a hard coating layer and an anti-static layer disposed on an upper portion of the hard coating layer, the window panel itself has excellent anti-static properties, and the effect of minimizing touch noise in the display device including the window panel may be exhibited.

Figure 11:
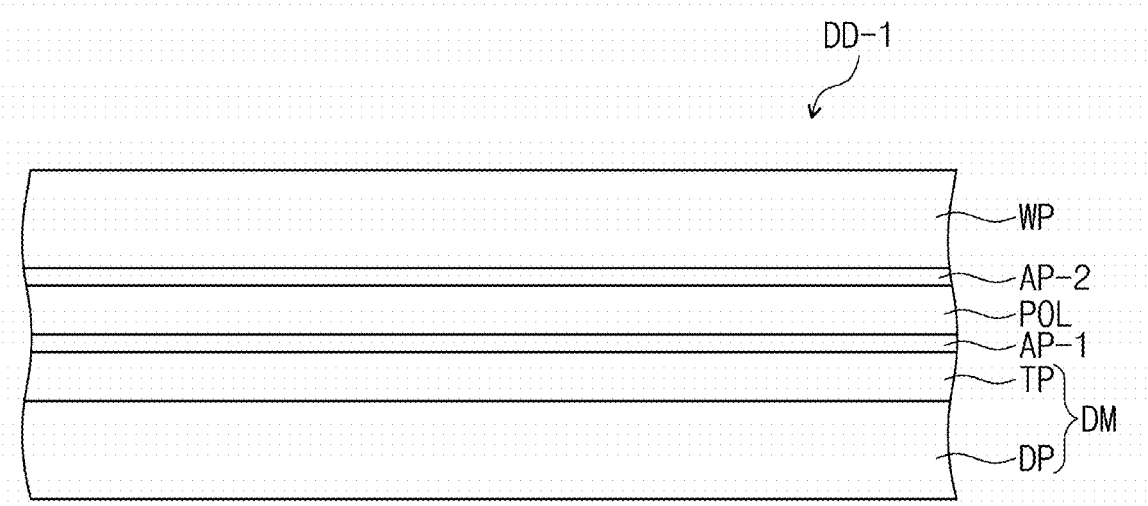
FIG. 11 is a plan view of an exemplary embodiment of a display device according to the invention.
Figure 12:
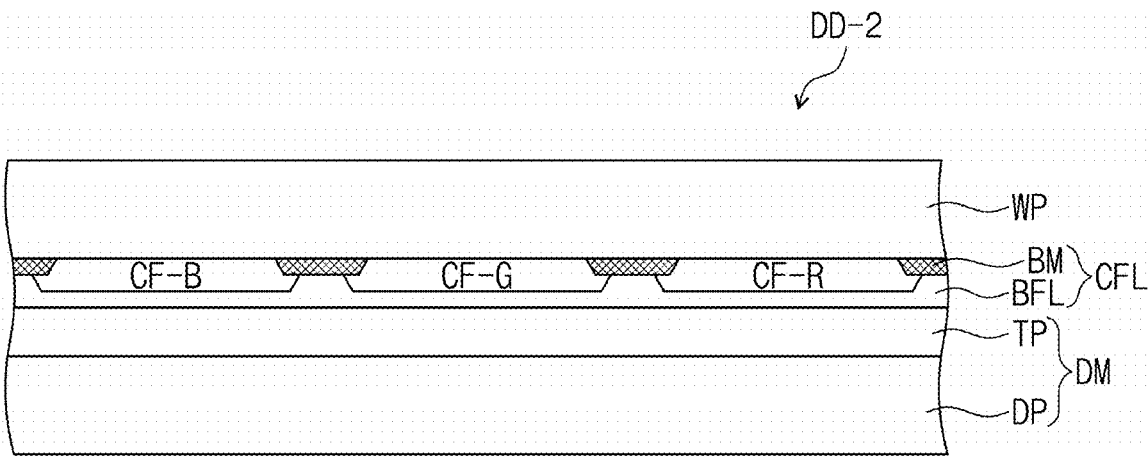
FIG. 12 is a cross-sectional view of an exemplary embodiment of a display device according to the invention.

FIGS. 11 and 12 are cross-sectional views of a display device in exemplary embodiments of the invention. FIGS. 11 and 12 show a portion of the display devices in exemplary embodiments of the invention. Hereinafter, in the description of the display devices shown in FIGS. 11 and 12, the same content as that described above with reference to FIGS. 1 to 10 will not be described again. Instead, differences will be mainly described.

Each of the display devices DD-1 and DD-2 in exemplary embodiments illustrated in FIGS. 11 and 12 may include a display module DM including a display panel DP and an input sensing unit TP and a window panel WP disposed on the display module DM. In an exemplary embodiment, the display panel DP used in each of FIGS. 11 and 12 may be an organic electroluminescence display panel or a quantum dot light emitting display panel, for example. The window panels WP and WP-1 respectively illustrated in FIG. 6 and FIG. 7 may be used as the window panels WP in FIGS. 11 and 12.

When compared with the display device DD of the exemplary embodiment illustrated in FIG. 5 and the like, the display device DD-1 of the exemplary embodiment illustrated in FIG. 11 may further include a polarizing layer POL. The display device DD-1 of the exemplary embodiment may include a display panel DP, an input sensing unit TP disposed on the display panel DP, a window panel WP disposed on the input sensing unit TP, and a polarizing layer POL disposed between the input sensing unit TP and the window panel WP.

The polarizing layer POL may block external light provided to the display panel DP from the outside. The polarizing layer POL may block a portion of external light.

In addition, the polarizing layer POL may reduce reflection light generated in the display panel DP due to external light. In an exemplary embodiment, the polarizing layer POL may serve to block reflection light which is generated when light provided from the outside of the display device DD is incident on the display panel DP and emitted again, for example. In an exemplary embodiment, the polarizing layer POL may include a circular polarizer having an anti-reflection function or the polarizing layer POL may include a linear polarizer and a λ/4 phase retarder, for example.

On an upper portion and a lower portion of the polarizing layer POL, adhesive layers AP-1 and AP-2 may be further disposed. A first adhesive layer AP-1 may be disposed between the display module DM and the polarizing layer POL, and a second adhesive layer AP-2 may be disposed between the polarizing layer POL and the window panel WP. In an exemplary embodiment, the first and second adhesive layers AP-1 and AP-2 may be optical clear adhesive layers, for example.

When the polarizing layer POL is directly disposed on the display module DM or when the polarizing layer POL is directly disposed on the window panel WP, the first and second adhesive layers AP-1 and AP-2 may be omitted.

When compared with the display device DD of the exemplary embodiment illustrated in FIG. 5 and the like, a display device DD-2 of an exemplary embodiment illustrated in FIG. 12 may further include a color filter layer CFL. The color filter layer CFL may block external light provided to the display panel DP from the outside of the display device DD. The color filter layer CFL may perform an anti-reflection function to minimize reflection caused by external light.

The color filter layer CFL may include a light blocking unit BM and a plurality of filters CF-B, CF-G, and CF-R. That is, the color filter layer CFL may include a first filter CF-B for transmitting a first color light, a second filter CF-G for transmitting a second color light, and a third filter CF-R for transmitting a third color light. In an exemplary embodiment, the first filter CF-B may be a blue filter, the second filter CF-G may be a green filter, and the third filter CF-R may be a red filter, for example.

Each of the filters CF-B, CF-G, and CF-R may include a polymer photosensitive resin and a pigment or a dye. The first filter CF-B may include a blue pigment or a blue dye, the second filter CF-G may include a green pigment or a green dye, and the third filter CF-R may include a red pigment or a red dye. However, the invention is not limited thereto. In another exemplary embodiment, the first filter CF-B may not include a pigment or a dye. In another exemplary embodiment, the first filter CF-B may include a polymer photosensitive resin, but may not include a pigment or a dye. In an exemplary embodiment, the first filter CF-B may be transparent. In an exemplary embodiment, the first filter CF-B may include a transparent photosensitive resin.

The light blocking unit BM may be a black matrix. The light blocking unit BM may be provided by including an organic light blocking material or an inorganic light blocking material, both including a black pigment or a black dye. The light blocking unit BM may prevent a light leakage phenomenon and distinguish the boundaries between the adjacent filters CF-B, CF-G, and CF-R.

The color filter layer CFL may further include a buffer layer BFL. In an exemplary embodiment, the buffer layer BFL may be a protection layer for protecting the filters CF-B, CF-G, and CF-R, for example. In an exemplary embodiment, the buffer layer BFL may be an inorganic material layer including at least one inorganic material among silicon nitride, silicon oxide, and silicon oxynitride. The buffer layer BFL may include a single layer or a plurality of layers.

In an exemplary embodiment, each of the first to three filters CF-B, CF-G, and CF-R may be disposed respectively corresponding to a blue light emitting region PXA-B, a green light emitting region PXA-G, and a red light emitting region PXA-R of the display panel DP illustrated in FIG. 8.

Each of the display devices DD-1 and DD-2 of the exemplary embodiments illustrated in FIGS. 11 and 12 may include an anti-static agent in the window panel WP disposed on an upper portion of the input sensing unit TP included in the display module DM, and thus, may exhibit good touch sensitivity. Particularly, in the window panel WP included in each of the display devices DD-1 and DD-2 of the exemplary embodiments, an anti-static agent is provided as a functional layer together with a hard coating agent, so that it is possible to minimize influence on the touch recognition performance of the input sensing unit TP.

Also, each of the display devices DD-1 and DD-2 in the exemplary embodiments illustrated in FIGS. 11 and 12 may include the window panel WP-1 (refer to FIG. 7) including a hard coating layer including a hard coating agent and an anti-static layer disposed on an upper portion of the hard coating layer and including an anti-static agent. In this case also, since the anti-static layer is spaced apart from the input sensing unit TP, it is possible to minimize influence on the touch recognition performance of the input sensing unit TP.

A display device of an exemplary embodiment includes a window panel having a functional layer including an anti-static agent, and thus, may exhibit good anti-static properties and good touch sensitivity. A display device of an exemplary embodiment uses a window panel provided with a functional layer including an anti-static agent and a hard coating agent, or uses a window panel including a hard coating layer including a hard coating agent and an anti-static layer disposed on an upper portion of the hard coating layer and including an anti-static agent, so that the surface damage caused by foreign matters introduced due to the charging performance in a manufacturing process of the display device may be minimized.

In addition, a display device of an exemplary embodiment includes a display module in which an input sensing unit is directly disposed on a display panel, and may either use a window panel provided with a functional layer including an anti-static agent and a hard coating agent or a window panel including a hard coating layer including a hard coating agent and an anti-static layer disposed on an upper portion of the hard coating layer and including an anti-static agent, so that it is possible to minimize touch noise which may be caused by the window panel.

As described above, a display device of an exemplary embodiment includes a window panel in which a hard coating layer includes an anti-static agent or a window panel in which an anti-static layer is disposed on an upper portion of a hard coating layer, thereby having improved anti-static properties, so that appearance defects caused due to attachment of foreign matters may be minimized.

A display device of an exemplary embodiment includes a window panel in which a hard coating layer includes an anti-static agent or a window panel in which an anti-static layer is disposed on an upper portion of a hard coating layer, thereby decreasing touch noise and exhibiting excellent display quality.

According to the invention, an input sensing panel may include a sensor unit and an insulation layer. On an upper surface of the insulation layer, a plurality of holes may be provided. Light incident on a display device and light reflected from the sensor unit may be incident on the plurality of holes. Light incident on each of the plurality of holes may be reflected from each side wall of the plurality of holes and trapped inside the plurality of holes. Light reflected from the outside of the display device may not be visible. The visibility of the display device may be improved.

Although the invention has been described with reference to a preferred embodiment of the invention, it will be understood by those skilled in the art that various changes in form and details may be made therein without departing from the spirit and scope of the invention.

Accordingly, the technical scope of the invention is not intended to be limited to the contents set forth in the detailed description of the specification, but is intended to be defined by the appended claims.

What is claimed is:

1. A display device including at least one folding region, the display device comprising:
   a display module; and
   a window panel disposed on the display module, the window panel including:
      a base film including a lower portion facing the display module and an upper portion opposite to the lower portion; and
      a functional layer including:
         a hard coating layer disposed on the upper portion of the base film and including a hard coating agent; and
         an anti-static layer directly disposed on an upper portion of the hard coating layer and including an anti-static agent such that the hard coating layer is interposed between the base film and the anti-static layer.

2. The display device of claim 1, wherein a weight of the anti-static agent based on a total weight of the functional layer is about 5 wt % to about 15 wt %.

3. The display device of claim 1, wherein the window panel has a surface resistance greater than about $10^9$ ohms/square and less than about $10^{13}$ ohms/square.

4. The display device of claim 1, wherein the anti-static agent comprises at least one among $Sb_2O_5$, $SnO_2$, ammonium (NH4+), phosphonium (PH4+), imidazolium, pyridinium, and lithium ions (Li+).

5. The display device of claim 1, wherein the display module comprises:
   a display panel; and
   an input sensing unit directly disposed on the display panel.

6. The display device of claim 5, wherein
   the display panel comprises a display element layer and an encapsulation layer disposed on the display element layer, and
   the input sensing unit is directly disposed on the encapsulation layer.

7. The display device of claim 1, wherein the window panel further comprises an anti-fingerprint layer disposed on the functional layer.

8. The display device of claim 1, further comprising a polarizing layer disposed between the display module and the window panel.

9. The display device of claim 1, further comprising a color filter layer disposed between the display module and the window panel.

10. The display device of claim 1, wherein the at least one folding region has a radius of curvature of about 5 millimeters or less.

11. A display device comprising:
    a display panel;
    an input sensing unit directly disposed on an upper portion of the display panel; and
    a window panel disposed on an upper portion of the input sensing unit, the window panel including:
       a base film including a lower portion facing the display panel and an upper portion opposite to the lower portion; and
       a functional layer including:
          a hard coating layer including a hard coating agent and disposed on the upper portion of the base film; and
          an anti-static agent layer directly disposed on an upper portion of the hard coating layer and including an anti-static agent such that the hard coating layer is interposed between the base film and the anti-static layer.

12. The display device of claim 11, wherein the display panel comprises:
    non-folding regions; and
    a folding region disposed between the non-folding regions.

13. A display device including a folding region deformable into a folded shape along a folding axis extending in one direction, the display device comprising:
    a display panel;
    an input sensing unit disposed on the display panel; and
    a window panel disposed on the input sensing unit, the window panel including:

a base film including a lower portion facing the display panel and an upper portion opposite to the lower portion;
a functional layer including:
a hard coating layer including a hard coating agent and disposed on the upper portion of the base film; and
an anti-static layer directly disposed on an upper portion of the hard coating layer and including an anti-static agent such that the hard coating layer is interposed between the base film and the anti-static layer; and
an anti-fingerprint layer disposed on the functional layer.

14. The display device of claim 13, wherein the anti-static agent comprises lithium ions (Li+).

15. A display device including at least one folding region, the display device comprising:
a display module; and
a window panel disposed on the display module, the window panel comprises:
a base film including a lower portion facing the display module and an upper portion opposite to the lower portion; and
a functional layer directly disposed on the upper portion of the base film,
wherein the functional film is a single layer and includes both a hard coating agent and an anti-static agent.

16. The display device of claim 15, wherein a weight of the anti-static agent based on a total weight of the functional layer is about 5 wt % to about 15 wt %.

* * * * *